(12) United States Patent  
Nakamura

(10) Patent No.: US 6,421,404 B1
(45) Date of Patent: Jul. 16, 2002

(54) PHASE-DIFFERENCE DETECTOR AND CLOCK-RECOVERY CIRCUIT USING THE SAME

(75) Inventor: Kazuyuki Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/326,709

(22) Filed: Jun. 7, 1999

(30) Foreign Application Priority Data

Jun. 9, 1998 (JP) ............................................. 10-160045

(51) Int. Cl.$^7$ ................................................ H04L 7/00
(52) U.S. Cl. ........................ 375/354; 375/376; 375/374; 375/375
(58) Field of Search ................................. 375/374, 375, 375/376, 326, 327, 371, 354; 327/141; 377/64, 78, 75, 81

(56) References Cited

U.S. PATENT DOCUMENTS 5,689,530 A * 11/1997 Honaker, Jr. ................. 375/286
5,694,062 A * 12/1997 Welch et al. ................... 327/3
6,127,897 A * 10/2000 Sasaki .......................... 331/25

FOREIGN PATENT DOCUMENTS

JP  7131448    5/1995
JP  1022799    1/1998  ............ H03K/5/26

OTHER PUBLICATIONS

Halonen et al., "A 150Mbit/s CMOS Clock recovery PLL Including a New Improved Phase Detector and a Fully Integrated FLL", Proceedings of the 1998 IEEE International Symposium on Circuits and Systems, 1998, ISCAS '98, vol. 1, pp. 159–161.*

Charles R. Hogge, "A Self Correcting Clock Recovery Circuit", IEEE Transactions on Electron Devices, vol. ED–32, No. 12, pp. 2704–2706, Dec., 1985.

* cited by examiner

Primary Examiner—Chi Pham
Assistant Examiner—Dung X. Nguyen
(74) Attorney, Agent, or Firm—Young & Thompson

(57) ABSTRACT

A phase-difference detector which uses a clock signal whose frequency is half the data rate, receives data at both rise timing and decay timing of the clock signal, and outputs phase-difference information between the data input signal and the clock signal. The detector has a circuit that comprises first and second register circuits for receiving a data input signal in synchronism with the decay timing and rising timing of the clock signal, respectively; a first exclusive OR circuit with two input terminals connected with the data input and the output terminal of the first register circuit; a second exclusive OR circuit with two input terminals connected with the outputs of the two register circuits; a first AND circuit for calculating the logical product of the inverted signal of the output of the first exclusive OR circuit and the inverted signal of the clock signal, and for producing a "down" signal; a second AND circuit for calculating the logical product of the output of the first exclusive OR circuit and the inverted clock signal; a third AND circuit with two input terminals connected with the output terminal of the first exclusive OR circuit and the inverted signal of the clock signal; and an OR circuit for calculating the logical result of the outputs of the second and third AND circuits, and for producing an "up" signal.

4 Claims, 10 Drawing Sheets

PHASE-DIFFERENCE DETECTOR AND CLOCK-RECOVERY CIRCUIT USING THE SAME

BACKGROUND OF THE INVENTION

1. Field of the Invention

The present invention relates to a phase-difference detector used for a PLL (phase-locked loop), which can be applied to optical communication or the like.

This application is based on Patent Application No. Hei 10-160045 filed in Japan, the contents of which are incorporated herein by reference.

2. Description of the Related Art

In a serial communication system such as an optical communication system, it is necessary to extract a clock component (or signal) from a serial data sequence at the receiving side, so as to receive data based on the extracted clock signal. The circuit for extracting a clock signal from a serial data sequence is called a clock-recovery circuit, which is a very important element for realizing an LSI used for the serial communication. This clock-recovery circuit is a kind of PLL, and can be generally realized using the structure shown in FIG. 6.

In FIG. 6, reference symbol PD indicates a phase-difference detector, which detects a phase difference between a clock signal output from the VCO (voltage-controlled oscillator) and an input data-signal sequence, and determines whether the current phase is advanced or delayed and outputs the determined results as phase-difference signals. The phase-difference signals, a set of pulse signals whose pulse widths are proportional to each phase difference, are output from the "down" terminal and the "up" terminal at the output side. In this clock-recovery circuit, these "down" and "up" signals are fed back (as an input signal) via a charge-pump circuit and a low-pass filter into the VCO, so that the phase of the extracted clock signal corresponds to that of the data input signal.

An example circuit of the conventional phase-difference detector is shown in FIG. 7. This circuit is disclosed by C. R. Hogge in "A Self Correcting Clock Recovery Circuit", IEEE Transactions on Electron Devices, Vol. ED-32, No. 12, pp. 2704–2706, December, 1985.

FIG. 8 is a timing chart showing the operations of the circuit of FIG. 7. This circuit comprises a flip-flop circuit FF1 into which a signal is input at (timing corresponding to) a rising edge of the clock signal, another flip-flop circuit FF2 which operates at (timing corresponding to) a decaying (or falling) edge of the clock signal, and two exclusive OR circuits XOR1 and XOR2.

The exclusive OR between the data input signal "din" and the output of FF1 is calculated so as to detect a phase difference between the clock signal and the data input signal, and a pulse signal whose pulse width corresponds to the detected phase difference is output from the "up" terminal. On the other hand, when a pulse signal is output from the "up" terminal, a pulse signal whose pulse width corresponds to half of the clock period is output from the "down" terminal.

As shown in the section from 3.0 ns to 4.0 ns in the horizontal axis in FIG. 8, when the difference between the rise timing of the clock signal and the transition timing of the data input signal becomes half of the clock period, the pulse width of the signal from the "up" terminal is half of the clock period. Therefore, the circuit as shown in FIG. 7 can detect the phase difference, and can be applied to the PD in FIG. 6, thereby realizing a clock-recovery circuit.

The circuit in FIG. 7 also has a data-recovery function for receiving and outputting data based on the extracted clock signal. That is, both (i) detection of the phase difference between the input data sequence and the extracted clock signal and (ii) data-receiving operation can be executed using the circuit of FIG. 7; thus, the structure of the LSI used for a communication system can be simplified.

However, in the phase-difference detector as shown in FIG. 7, a clock signal whose frequency can agree with the frequency of the data input signal (i.e., the data rate) is necessary. That is, as shown in the timing chart of FIG. 8, if the transition (between the high level and the low level) of the data input signal appears with a minimum period of 0.25 ns (see the section between 3 ns to 4 ns in FIG. 8), then the period of the clock signal must also be 0.25 ns. Here, each "transition" of the data input signal corresponds to a period from a rise to a decay (or fall) of the data input signal, or to a period from a decay to a rise of it.

Here, the period of the high level or the low level of the clock signal is 0.125 ns, that is, half of the clock period. Therefore, the clock signal must maintain a frequency two times as high as the data rate.

This requirement causes a serious problem, in particular, in a circuit design aimed at high-speed operations using the maximum efficiency of each device to be used. The possible frequency of the clock signal to be generated and divided is basically determined depending on the efficiency or performance of the device; thus, in the conventional circuit such as the above, the possible data rate is half or less of the device efficiency.

In order to solve the above problem, a circuit for receiving data using both the rising edge and the decaying edge of the clock signal is used for receiving a high-speed data input signal. A sample circuit is shown in FIG. 9. The data input signal input from the terminal "din" is distributed into two lines. The data signal received at the decay timing of the clock signal is output from terminal "dout0", while the data signal received at the rise timing of the clock signal is output from terminal "dout1". In this circuit, a clock signal whose frequency is half that of the data rate of the data input signal can be used. For example, a data input signal of 4 Gbps can be received using a clock signal of 2 GHz. That is, by using a device having the same performance as that used in the circuit of FIG. 7, high-speed operations at a frequency twice as high as that of the circuit of FIG. 7 can be expected. In addition, a plurality of the circuits as shown in FIG. 9 can be connected in a "tree" form and the frequency of the clock signal of each circuit can be half of the frequency of the clock signal of the previous circuit, thereby constructing a multi-bit output demultiplexer having a simple structure.

However, in the circuit as shown in FIG. 9, two distributed output signals are obtained with respect to a data input signal. In this case, accurate phase-difference information cannot be obtained only by simply calculating the exclusive OR between the data input signal and the output signal from the flip-flop circuit as calculated in the circuit of FIG. 7. The reason for this is as follows. In the circuit of FIG. 7, the data signal is always obtained from the output of flip-flop FF1; however, the circuit of FIG. 9 has different operations. For example, a data input signal which existed at each even-numbered position in the original serial data-signal sequence is output from FF1, while a data input signal which existed at each odd-numbered position in the original serial signal sequence is output from FF3. Therefore, even if the output of the "din" terminal thorough which all data passes and the output of FF1 which includes only half of the information of the data are simply compared, phase-difference information as obtained by the circuit of FIG. 7. cannot be generated in this case.

Accordingly, if the binary-tree type high-speed and simple structure as shown in FIGS. 9 and 10 is applied to the demultiplexer which needs the highest operational frequency so as to operate it at the highest speed, then a separate phase-difference detector is also necessary.

SUMMARY OF THE INVENTION

In order to realize a high-speed serial communication circuit, an objective of the present invention is to provide a phase-difference detector which can use a clock signal whose frequency is half of the data rate, receive data at both rise timing and decay timing of the clock signal, and output phase-difference information between the data input signal and the clock signal.

Therefore, the present invention provides a phase-difference detector comprising:

a data input terminal for inputting a data input signal;

a first register circuit for receiving the data input signal from the data input terminal in synchronism with the decay timing of a base clock signal;

a second register circuit for receiving the data input signal from the data input terminal in synchronism with the rise timing of the base clock signal;

a first exclusive OR circuit, two input terminals of which are connected with an input terminal and an output terminal of the first register circuit;

a second exclusive OR circuit, two input terminals of which are connected with the output terminal of the first register circuit and an output terminal of the second register circuit;

a first AND circuit, the inverted signal of an output of the first exclusive OR circuit and the inverted signal of the base clock signal being input into two input terminals of said first AND circuit;

a second AND circuit, the inverted signal of an output of the second exclusive OR circuit and the base clock signal being input into two input terminals of said second AND circuit;

a third AND circuit, the output of the first exclusive OR circuit and the inverted signal of the base clock signal being input into two input terminals of said third AND circuit; an OR circuit, outputs of the second and third AND circuits being input into two input terminals of said OR circuit;

a first output terminal for outputting an output of the first AND circuit; and a second output terminal for outputting an output of the OR circuit.

The phase-difference detector may further comprise a third register circuit for receiving a signal in synchronism with the rise timing of the base clock signal, an input terminal of which is connected with the output terminal of the first register circuit, wherein two distributed data signals are output from output terminals of both the second and third register circuits, thereby realizing a demultiplexing function.

The present invention also provides a clock-recovery circuit using a phase-difference detector as explained above, comprising:

the phase-difference detector for comparing an output of a voltage-controlled oscillator and the data input signal; and a charge-pump circuit, two output signals of the phase-difference detector, down and up signals, being input into two input terminals of said charge-pump circuit;

a low-pass filter, an output of the charge-pump circuit being input into an input terminal of said low-pass filter; and the voltage-controlled oscillator, an output of the low-pass filter being input into an input terminal of said voltage-controlled oscillator, for outputting the base clock signal.

That is, using the phase-difference detector according to the present invention in a clock-recovery circuit enables use of a clock signal whose frequency is half of the data rate so that the frequency of the clock signal can be matched with the transition frequency of the data input signal. Therefore, by using a device having the same performance as that of a device used in a conventional circuit, high-speed operations at a frequency twice as high as that of the conventional circuit can be realized.

Furthermore, two distributed data signals can be simultaneously obtained by using both rising and decaying edges of the base clock signal. Accordingly, a high-speed tree-type demultiplexer can be realized, thereby realizing a higher LSI used for serial communication.

DESCRIPTION OF THE PREFERRED EMBODIMENTS

Hereinafter, embodiments of the present invention will be explained with reference to the drawings.

Figure 1:
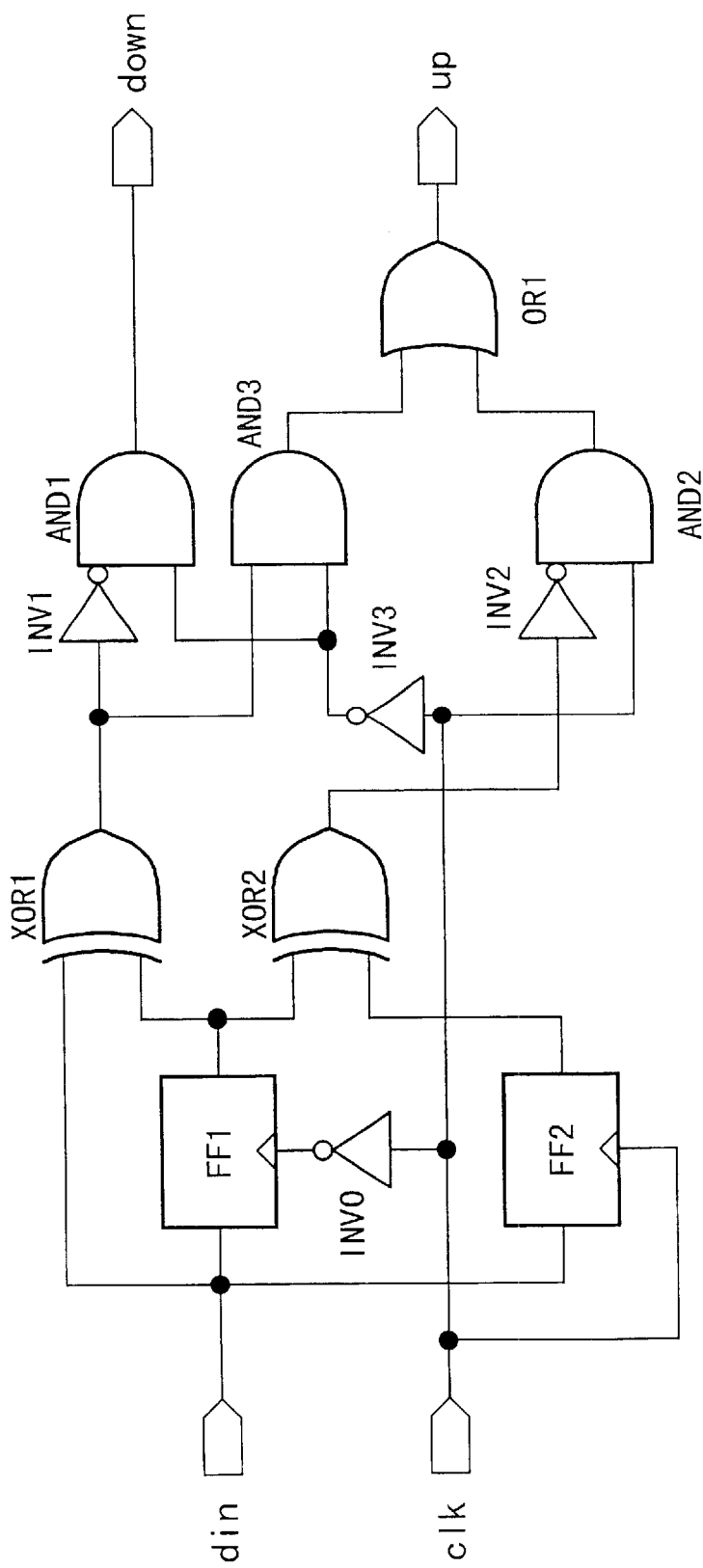
FIG. 1 is a circuit diagram of the phase-difference detector as the first embodiment according to the present invention.
Figure 2:
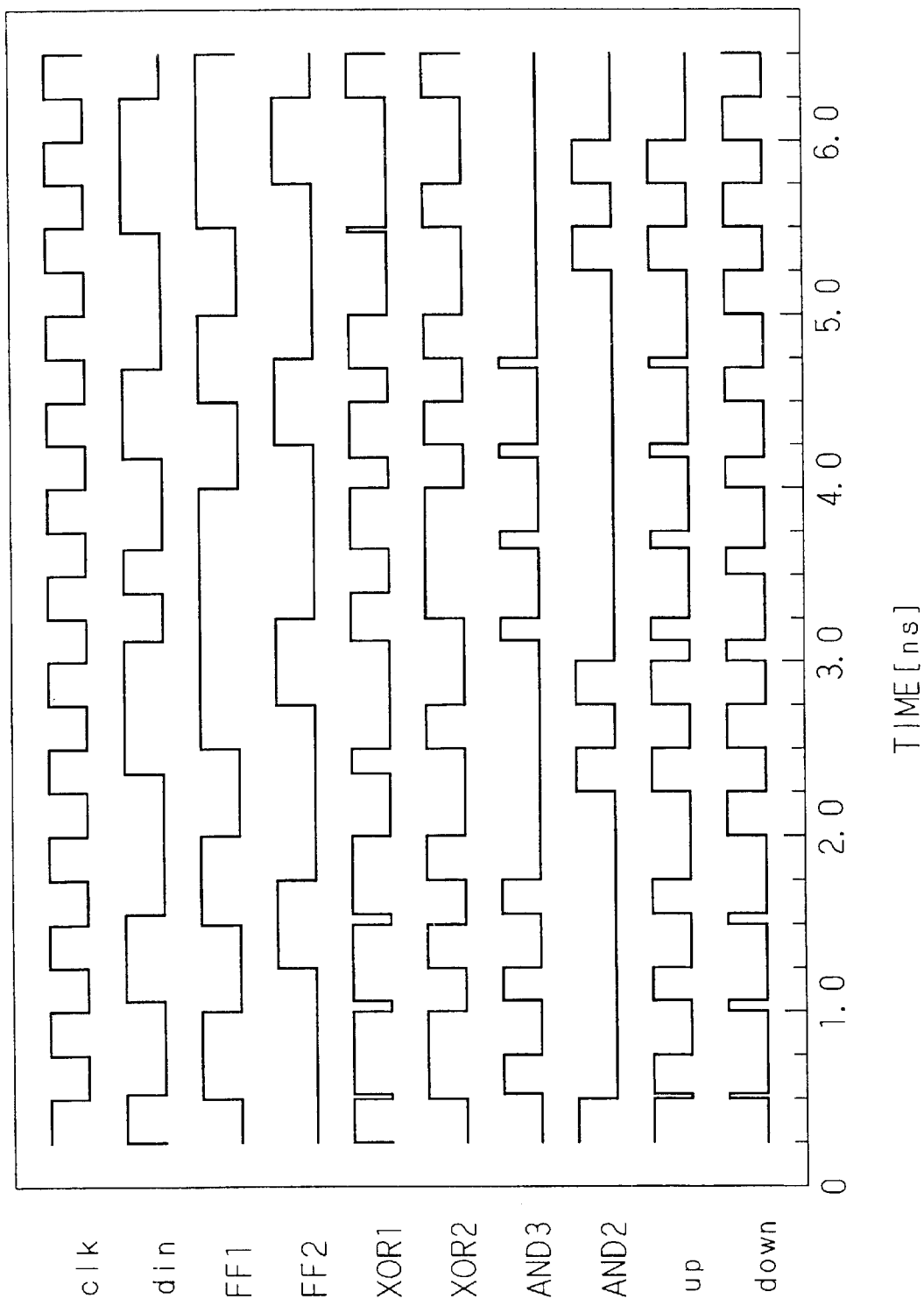
FIG. 2 is a timing chart showing the operations of the phase-difference detector shown in FIG. 1.

FIG. 1 shows a circuit arrangement as the first embodiment according to the present invention. FIG. 2 is a timing chart showing the operational timing of each element of the circuit in FIG. 1.

Figure 7:
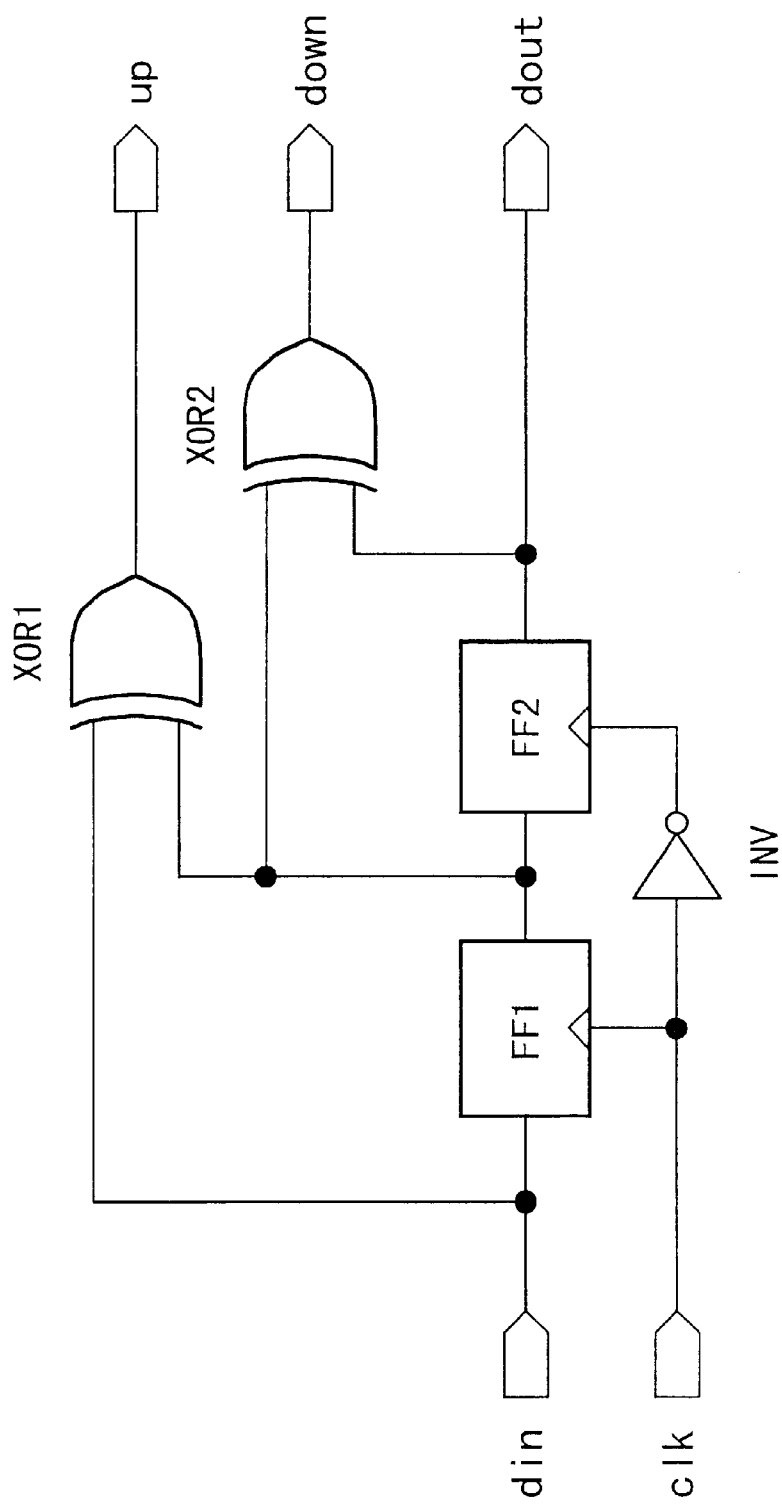
FIG. 7 is a circuit diagram of a conventional phase-difference detector.
Figure 8:
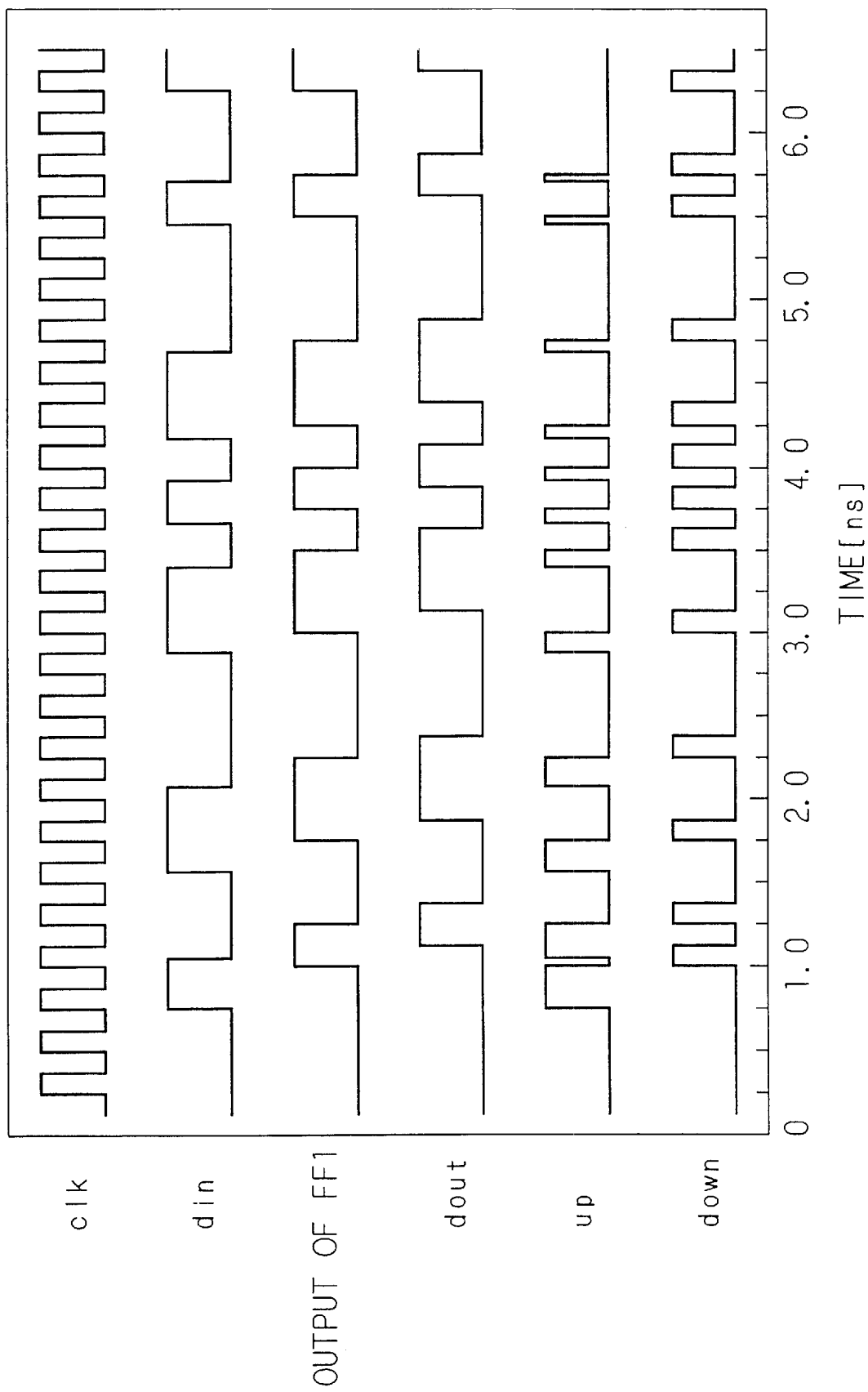
FIG. 8 is a timing chart showing the operations of the conventional phase-difference detector shown in FIG. 7.
Figure 9:
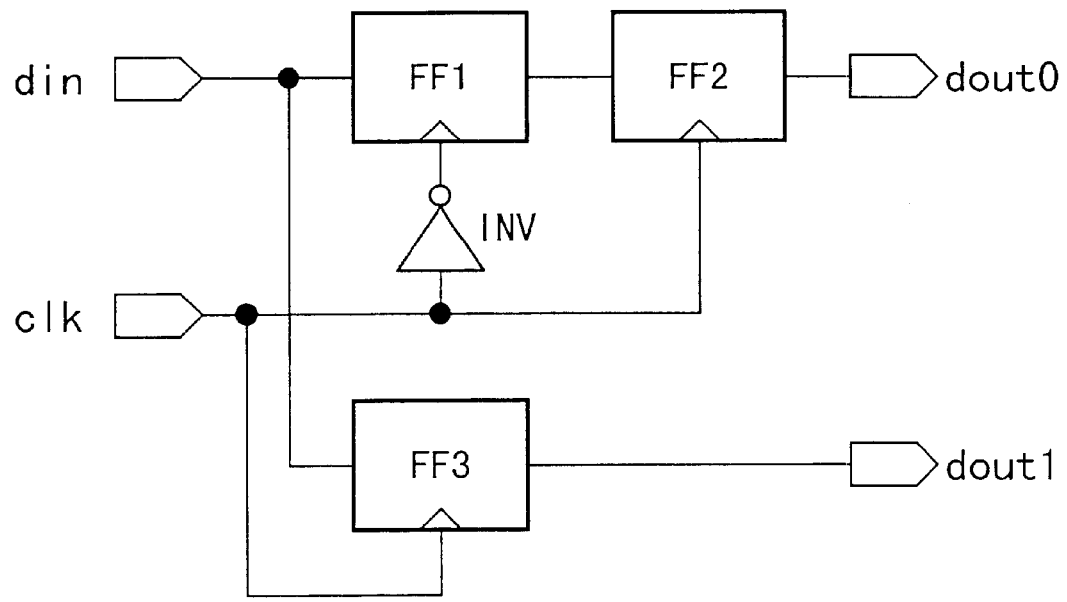
FIG. 9 is a circuit diagram of a conventional 1:2 demultiplexer.

Here, the frequency of the clock signal is half of that in the circuit as shown in FIG. 7. The output from flip-flop circuit FF1 is a signal which was received by the flip-flop circuit at the decay (or fall) timing of the clock signal, while another flip-flop circuit FF2 receives a signal at the rise timing of the clock signal.

As the above conventional circuit, the exclusive OR circuit XOR1 calculates an exclusive OR between the output of FF1 and the data input signal. As shown in FIG. 2, the output from XOR1 also includes some components of the signal which was received by flip-flop circuit FF2 at the rise timing of the clock signal. Therefore, the output of XOR1 is inverted, and then a logical product of this inverted signal and the inverted clock signal is calculated using circuit AND1 so that a "down" signal is obtained, which includes only components existing within the low level period of the clock signal.

As described above, the exclusive OR circuit XOR1 calculates an exclusive OR between the output of FF1 and the data input signal; however, the output of FF1 corresponds to the decaying (or falling) edge of the clock signal, and thus FF1 obtains half of the information about the data input signal "din". Therefore, only within each period from a decay timing to a rise timing of the clock signal, the output of XOR1 can be used as accurate phase-difference information with respect to the data input signal "din". Accordingly, the output of XOR1 is inverted, and the logical product of this inverted signal and the inverted clock signal is calculated using an AND circuit AND1 so as to extract only signal components existing within the low level state of the clock signal and to produce the "down" signal using the extracted components.

On the other hand, the logical product of the output of XOR1 and the inverted clock signal is calculated using an AND circuit AND3 so as to produce a pulse signal at the "up" side. However, if no transition occurs during a low level period of the clock signal, a pulse whose width is half of the pulse width of the clock signal appears in the "down" signal. The reason for this follows. In the present circuit, the timing of the data transition within each target period from a decaying edge to the next rising edge of the clock signal is detected, that is, the "down" signal exhibits an elapsed time to each transition point in this target period. Accordingly, if no transition occurs in a target period, the whole of this period is determined as a "down" period and thus a "down" pulse having the maximum width is generated.

The following is the method of canceling such a pulse. First, the exclusive OR between the outputs of FF1 and FF2 is calculated using an exclusive OR circuit XOR2 so as to detect whether a transition occurs in the data input signal during each low level period of the clock signal. In the low level period of the output signal of XOR2, it is determined that no transition occurs in the relevant low level period of the clock signal. Therefore, the logical product of the inverted signal of the output of XOR2 and the clock signal is calculated using an AND circuit AND2. The obtained pulses are incorporated into the above "up" signal by using an OR circuit OR1, so as to cancel the above pulses having the maximum width in the "down" signal.

According to the above logical-circuit arrangement, accurate phase-difference information can be output with a clock signal whose frequency is half of that used in the conventional circuit.

Figure 3:
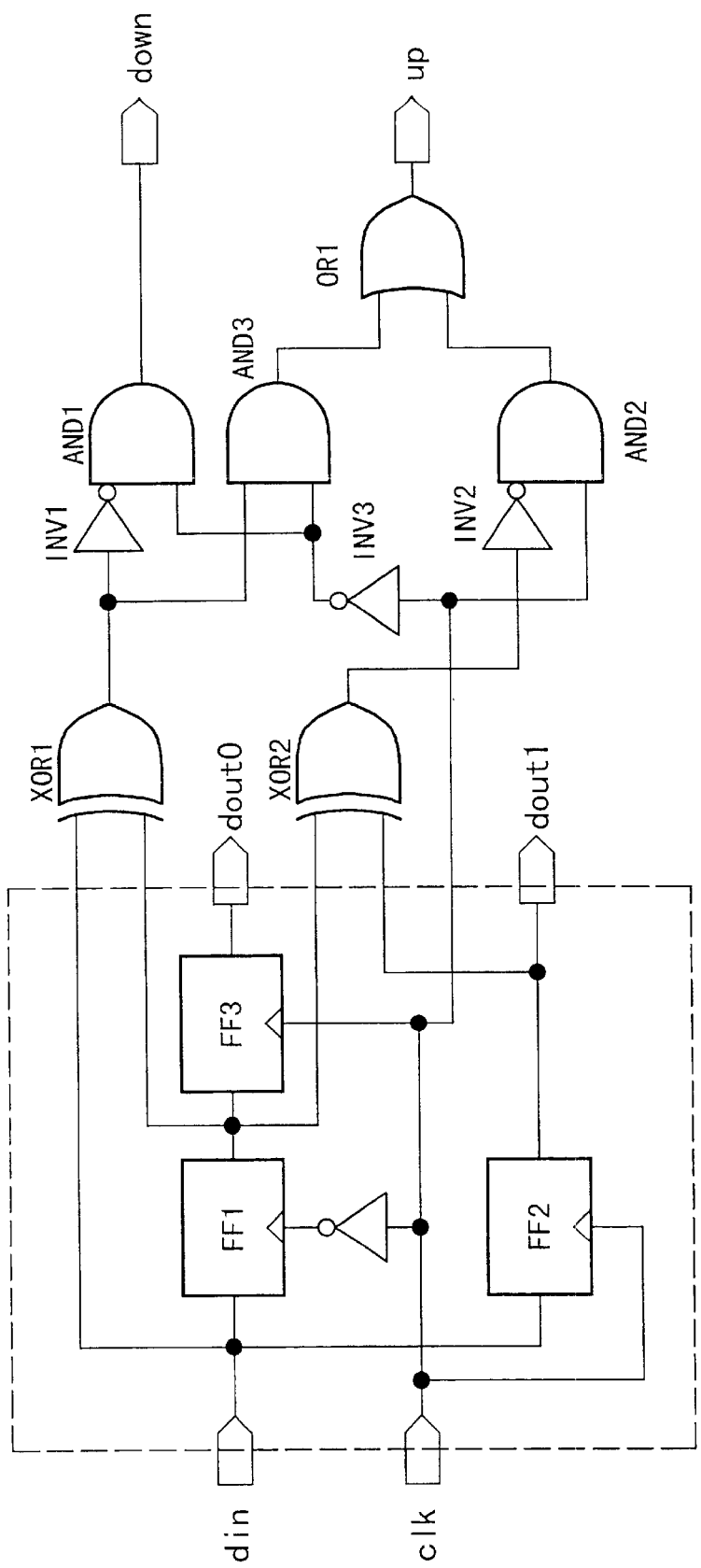
FIG. 3 is a circuit diagram of the phase-difference detector as the second embodiment according to the present invention.
Figure 10:
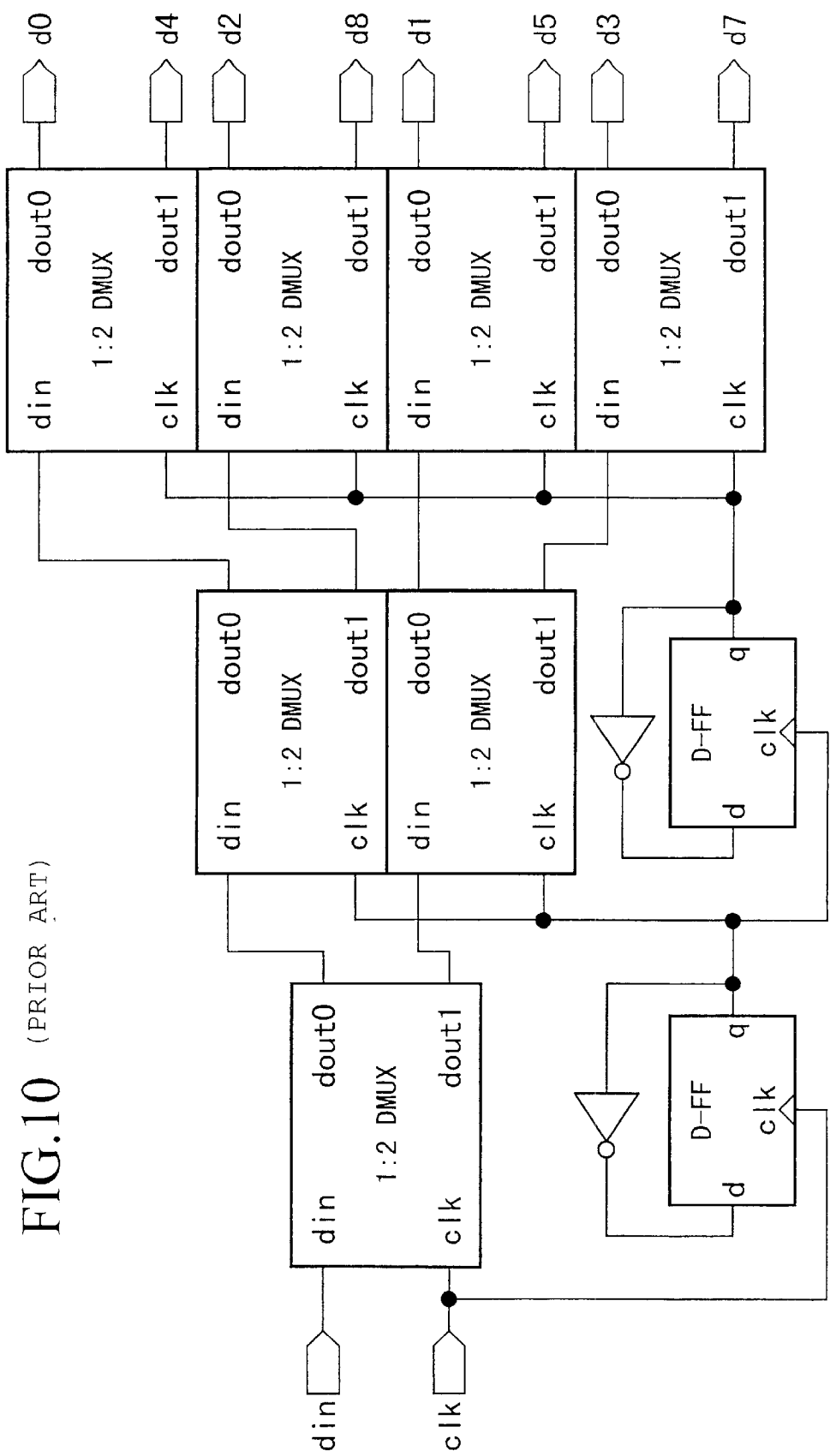
FIG. 10 is a circuit diagram of a conventional tree-type 1:8 demultiplexer.

FIG. 3 shows the second embodiment according to the present invention. This phase-difference detector can function as a 1:2 demultiplexer. In comparison with the circuit as shown in FIG. 1, another flip-flop circuit FF3 is added, and two distributed data outputs "dout0" and "dout1" are respectively output from FF2 and FF3. The present circuit can function as the first stage of the tree-type demultiplexer as shown in FIG. 10 and also as a phase-difference detector.

Figure 4:
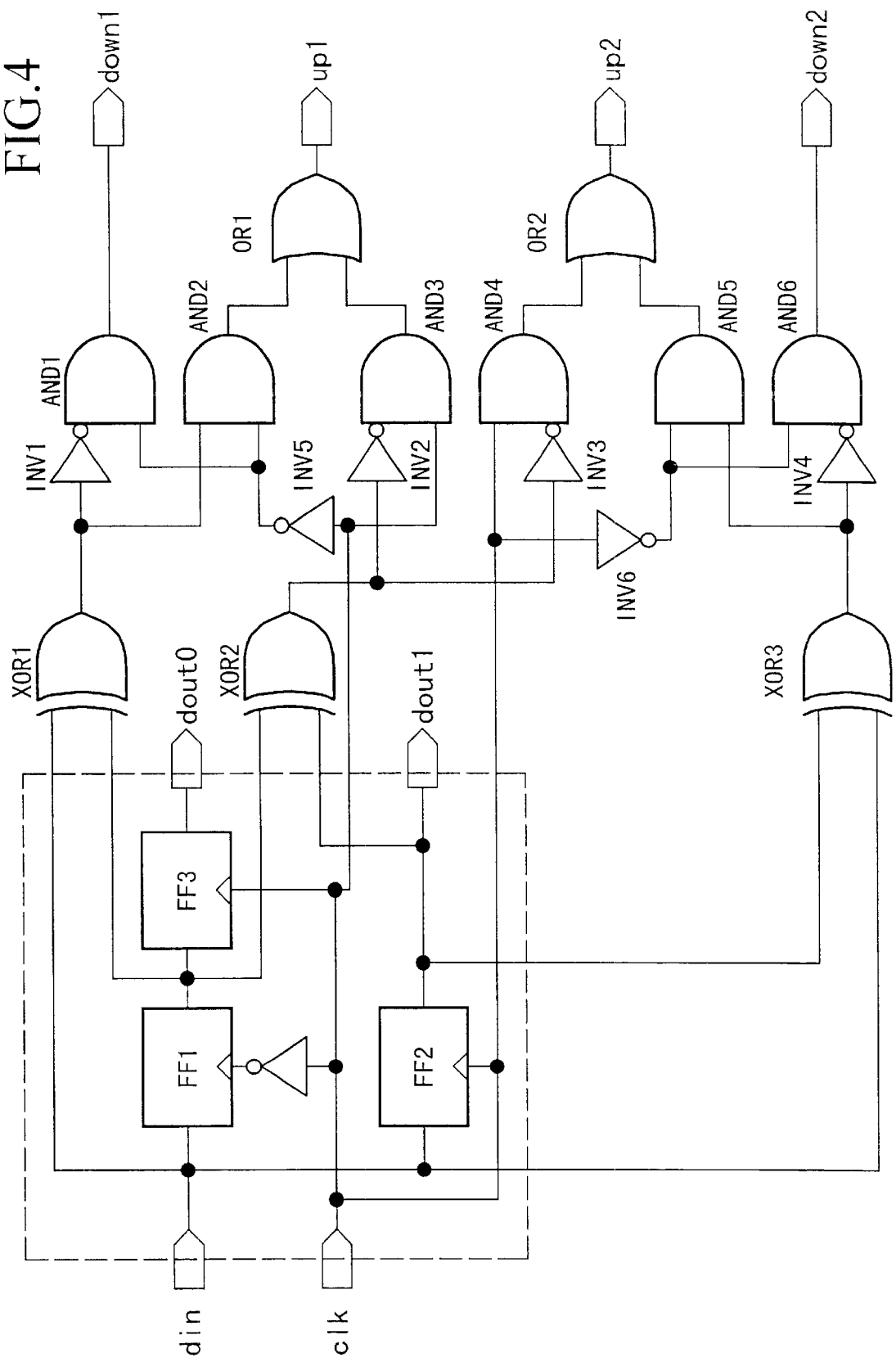
FIG. 4 is a circuit diagram of the third embodiment, in which the present invention is applied to a complementary circuit.

FIG. 4 shows the third embodiment, in which the present invention is applied to a complementary circuit. In this arrangement, phase-difference information can be output not only in the low level period but also in the high level period of the clock signal. In FIG. 4, phase-difference information corresponding to the low level period of the clock signal is obtained from output terminals "up1" and "down1", while phase-difference information corresponding to the high level period of the clock signal is obtained from output terminals "up2" and "down2".

Figure 5:
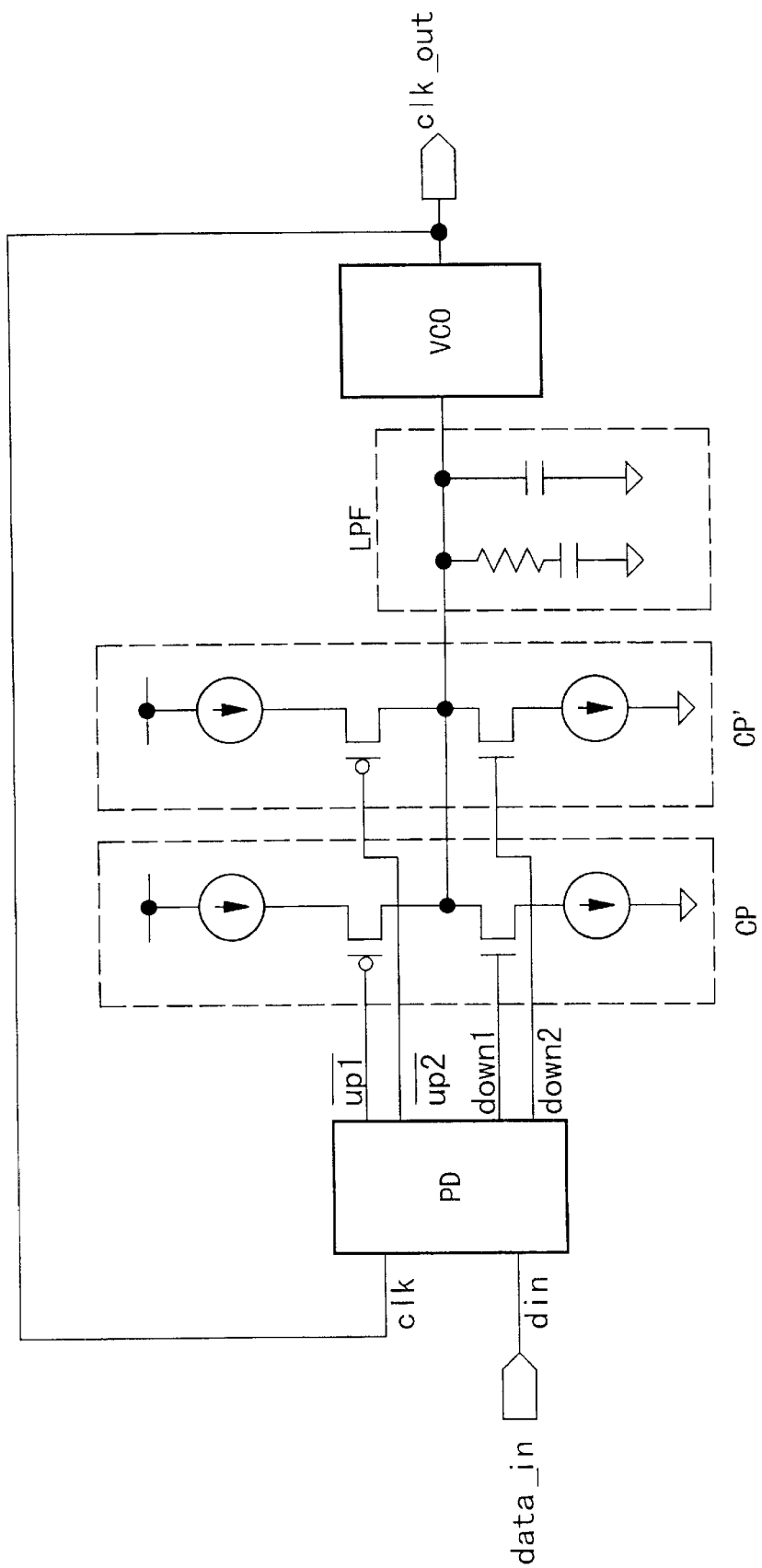
FIG. 5 is a circuit diagram of the clock-recovery circuit using the phase-difference detector shown in FIG. 4.
Figure 6:
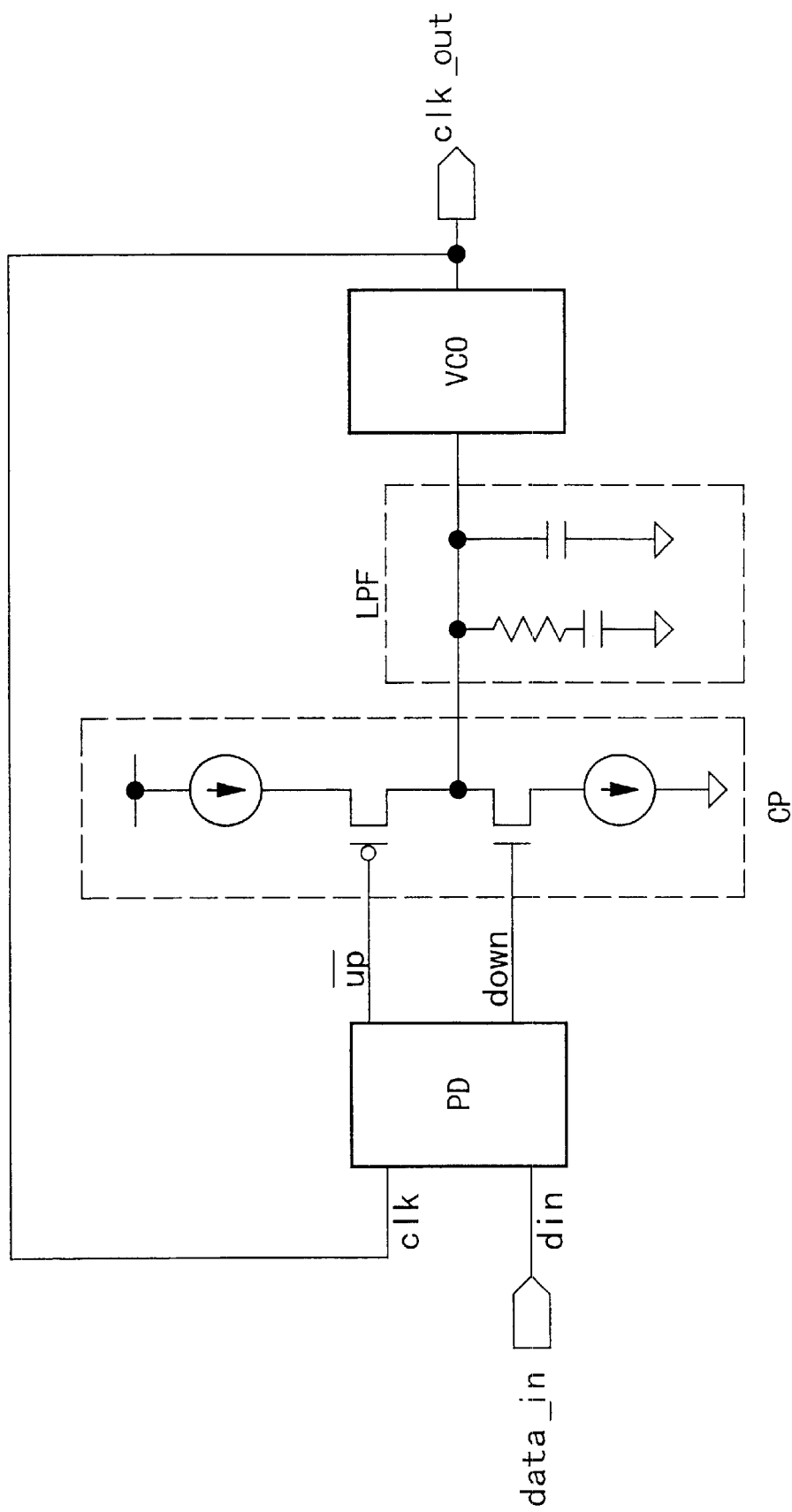
FIG. 6 is a circuit diagram of a conventional clock-recovery circuit.

FIG. 5 shows a clock-recovery circuit using the circuit of FIG. 4 as the phase-difference detector in this clock-recovery circuit. In this structure, two charge-pump circuits are provided corresponding to two sets of "up" and "down" phase-difference information outputs, thereby realizing a clock-recovery circuit.

What is claimed is:

1. A phase-difference detector comprising:

a data input terminal for inputting a data input signal;

a first register circuit for receiving the data input signal from the data input terminal in synchronism with the decay timing of a base clock signal;

a second register circuit for receiving the data input signal from the data input terminal in synchronism with the rise timing of the base clock signal;

a first exclusive OR circuit, two input terminals of which are connected with an input terminal and an output terminal of the first register circuit;

a second exclusive OR circuit, two input terminals of which are connected with the output terminal of the first register circuit and an output terminal of the second register circuit;

a first AND circuit, the inverted signal of an output of the first exclusive OR circuit and the inverted signal of the base clock signal being input into two input terminals of said first AND circuit;

a second AND circuit, the inverted signal of an output of the second exclusive OR circuit and the base clock signal being input into two input terminals of said second AND circuit;

a third AND circuit, the output of the first exclusive OR circuit and the inverted signal of the base clock signal being input into two input terminals of said third AND circuit; an OR circuit, outputs of the second and third AND circuits being input into two input terminals of said OR circuit;

a first output terminal for outputting an output of the first AND circuit; and a second output terminal for outputting an output of the OR circuit.

2. A phase-difference detector as claimed in claim 1, further comprising:

a third register circuit for receiving a signal in synchronism with the rise timing of the base clock signal, an input terminal of which is connected with the output terminal of the first register circuit, wherein:
two distributed data signals are output from output terminals of both the second and third register circuits, thereby realizing a demultiplexing function.

3. A clock-recovery circuit using a phase-difference detector as claimed in claim 1, comprising:

the phase-difference detector for comparing an output of a voltage-controlled oscillator and the data input signal; and a charge-pump circuit, two output signals of the phase-difference detector, down and up signals, being input into two input terminals of said charge-pump circuit;

a low-pass filter, an output of the charge-pump circuit being input into an input terminal of said low-pass filter; and the voltage-controlled oscillator, an output of the low-pass filter being input into an input terminal of said voltage-controlled oscillator, for outputting the base clock signal.

4. A clock-recovery circuit using a phase-difference detector as claimed in claim 2, comprising:

the phase-difference detector for comparing an output of a voltage-controlled oscillator and the data input signal; and a charge-pump circuit, two output signals of the phase-difference detector, down and up signals, being input into two input terminals of said charge-pump circuit;

a low-pass filter, an output of the charge-pump circuit being input into an input terminal of said low-pass filter; and the voltage-controlled oscillator, an output of the low-pass filter being input into an input terminal of said voltage-controlled oscillator, for outputting the base clock signal.

* * * * *